(12) United States Patent
Ho et al.

(10) Patent No.: US 11,476,293 B2
(45) Date of Patent: Oct. 18, 2022

(54) MANUFACTURING METHOD OF CHIP PACKAGE

(71) Applicant: XINTEC INC., Taoyuan (TW)

(72) Inventors: Yen-Shih Ho, Kaohsiung (TW); Tsang-Yu Liu, Zhubei (TW); Po-Han Lee, Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 16/950,810

(22) Filed: Nov. 17, 2020

(65) Prior Publication Data

US 2021/0066379 A1 Mar. 4, 2021

Related U.S. Application Data

(62) Division of application No. 15/996,841, filed on Jun. 4, 2018, now abandoned.

(Continued)

(51) Int. Cl.
*H01L 27/146* (2006.01)
*H01L 23/00* (2006.01)

(52) U.S. Cl.
CPC ........ *H01L 27/14636* (2013.01); *H01L 24/02* (2013.01); *H01L 27/14618* (2013.01); *H01L 27/14632* (2013.01); *H01L 27/14685* (2013.01); *H01L 27/14687* (2013.01); *H01L 24/05* (2013.01); *H01L 24/13* (2013.01);
(Continued)

(58) Field of Classification Search
CPC ......... H01L 27/14636; H01L 27/14618; H01L 27/14687; H01L 27/14632; H01L 27/14685; H01L 24/02; H01L 27/14678; H01L 2224/02371; H01L 2224/02372; H01L 2224/02377; H01L 2224/02381; H01L 24/13; H01L 2224/13024; H01L 27/1462
See application file for complete search history.

(56) References Cited

U.S. PATENT DOCUMENTS

2009/0256260 A1 10/2009 Nakamura
2013/0119556 A1* 5/2013 Liu ...................... H01L 23/585
257/774
(Continued)

FOREIGN PATENT DOCUMENTS

CN 104615979 5/2015
CN 104681523 6/2015
(Continued)

*Primary Examiner* — Thanh T Nguyen
(74) *Attorney, Agent, or Firm* — Liu & Liu

(57) ABSTRACT

A manufacturing method of a chip package includes forming a temporary bonding layer on a carrier; forming an encapsulation layer on a top surface of a wafer or on the temporary bonding layer; bonding the carrier to the wafer, in which the encapsulation layer covers a sensor and a conductive pad of the wafer; patterning a bottom surface of the wafer to form a through hole, in which the conductive pad is exposed through the through hole; forming an isolation layer on the bottom surface of the wafer and a sidewall of the through hole; forming a redistribution layer on the isolation layer and the conductive pad that is in the through hole; forming a passivation layer on the isolation layer and the redistribution layer; and removing the temporary bonding layer and the carrier.

9 Claims, 18 Drawing Sheets

Related U.S. Application Data

(60) Provisional application No. 62/519,022, filed on Jun. 13, 2017.

(52) U.S. Cl.
CPC .... *H01L 27/1462* (2013.01); *H01L 27/14678* (2013.01); *H01L 2224/02371* (2013.01); *H01L 2224/02372* (2013.01); *H01L 2224/02377* (2013.01); *H01L 2224/02381* (2013.01); *H01L 2224/0401* (2013.01); *H01L 2224/05548* (2013.01); *H01L 2224/06131* (2013.01); *H01L 2224/06136* (2013.01); *H01L 2224/13022* (2013.01); *H01L 2224/13024* (2013.01); *H01L 2224/14131* (2013.01); *H01L 2224/14136* (2013.01); *H01L 2224/94* (2013.01)

(56) References Cited

U.S. PATENT DOCUMENTS

| | | | |
|---|---|---|---|
| 2013/0181313 A1 | 7/2013 | Nagata | |
| 2014/0183680 A1 | 7/2014 | Nabe | |
| 2014/0377909 A1* | 12/2014 | Chung | H01L 25/0657 438/113 |
| 2015/0325552 A1* | 11/2015 | Liu | H01L 24/14 257/738 |
| 2016/0043123 A1 | 2/2016 | Chien | |
| 2016/0141219 A1 | 5/2016 | Liu | |
| 2016/0212851 A1 | 7/2016 | Hu | |
| 2017/0116458 A1* | 4/2017 | Liu | H01L 24/03 |

FOREIGN PATENT DOCUMENTS

| | | |
|---|---|---|
| CN | 104900607 | 9/2015 |
| CN | 105590916 | 5/2016 |

\* cited by examiner

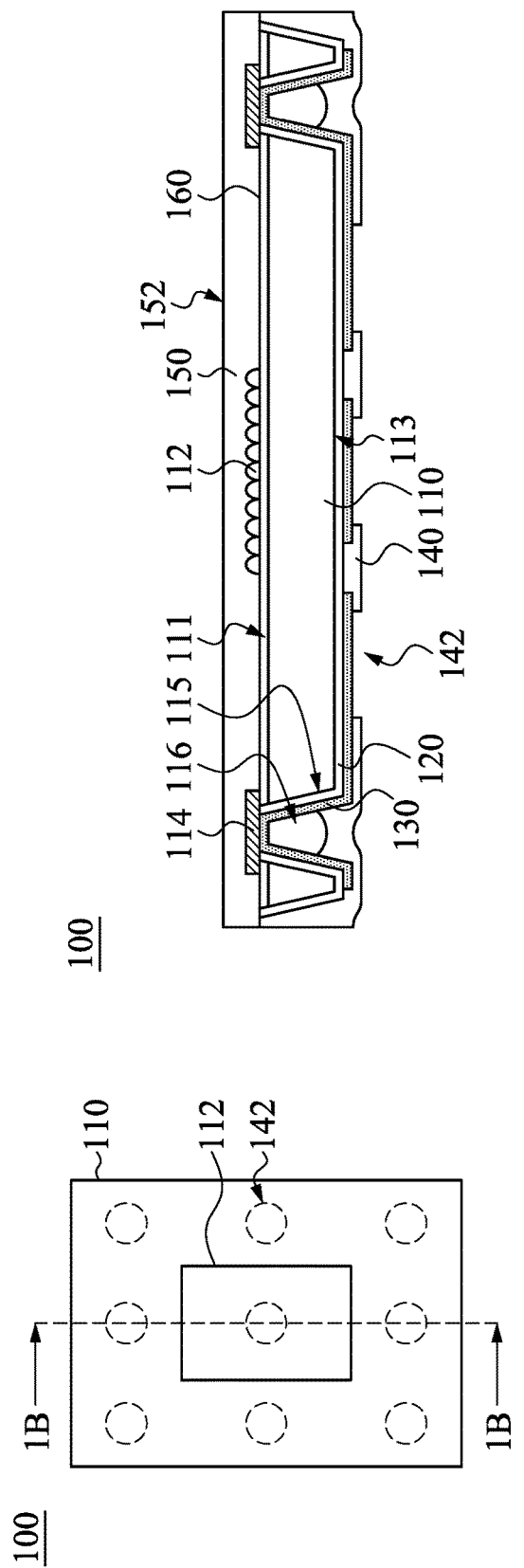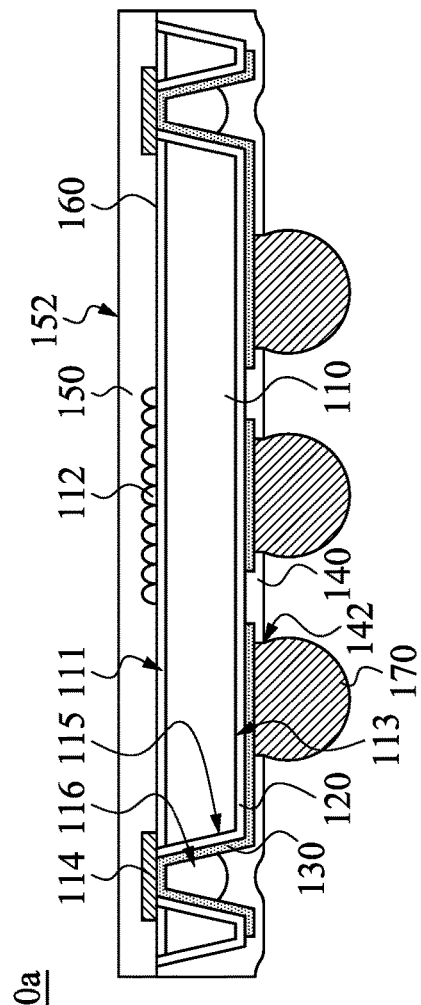
Fig. 1A
Fig. 1B
Fig. 2

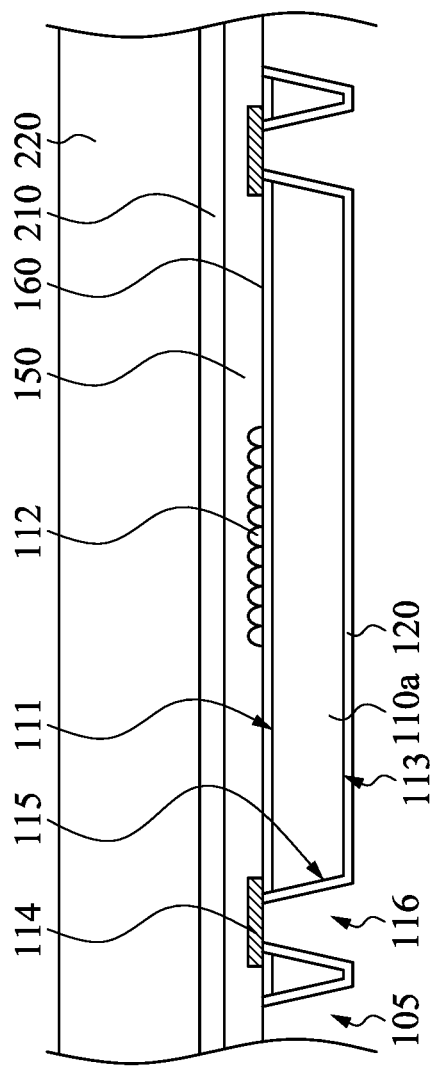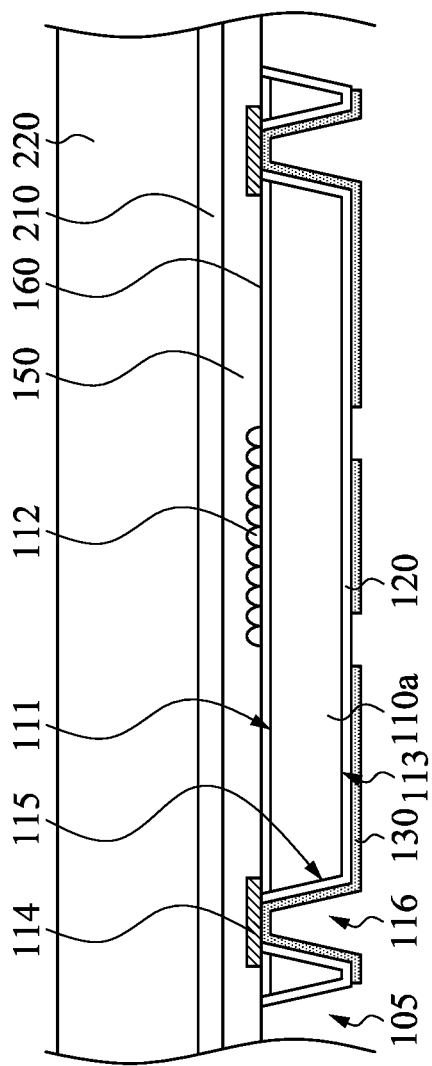

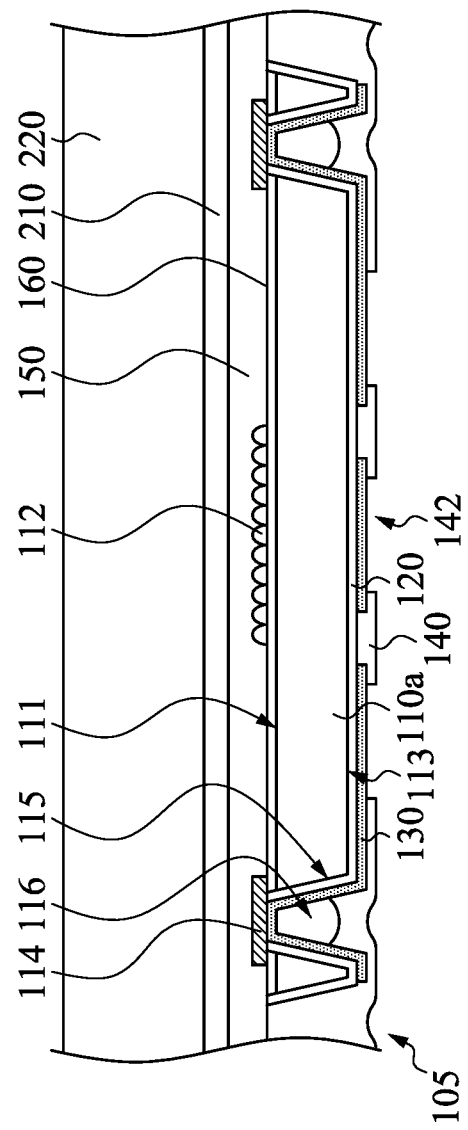
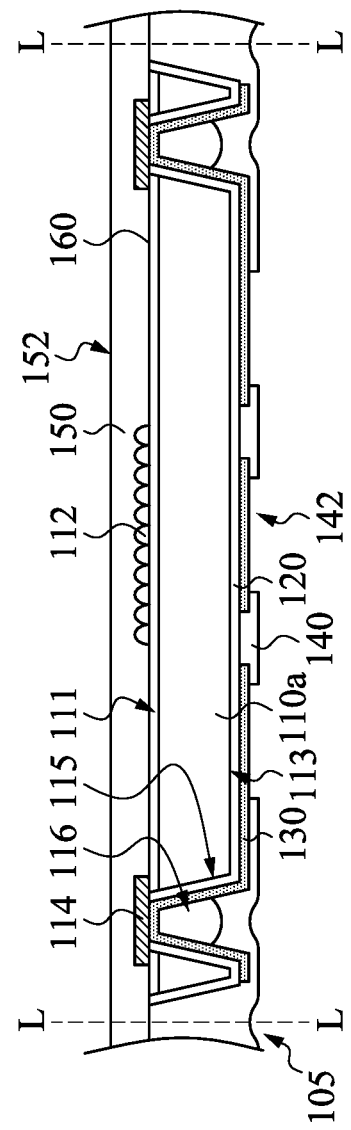
Fig. 7
Fig. 8

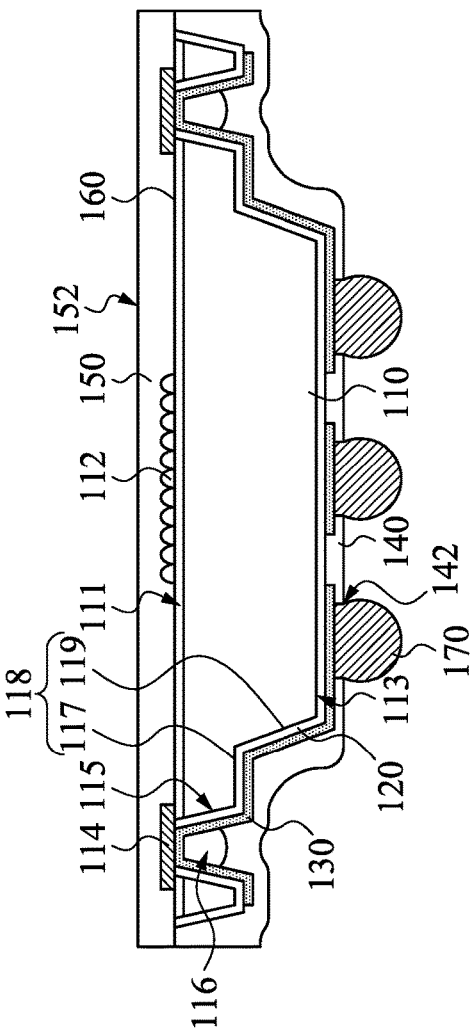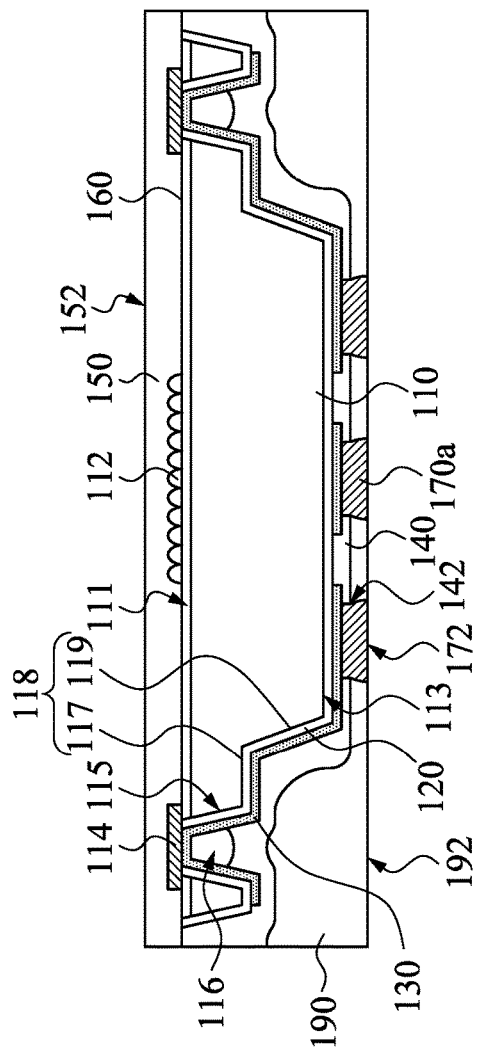
Fig. 10A
Fig. 10B

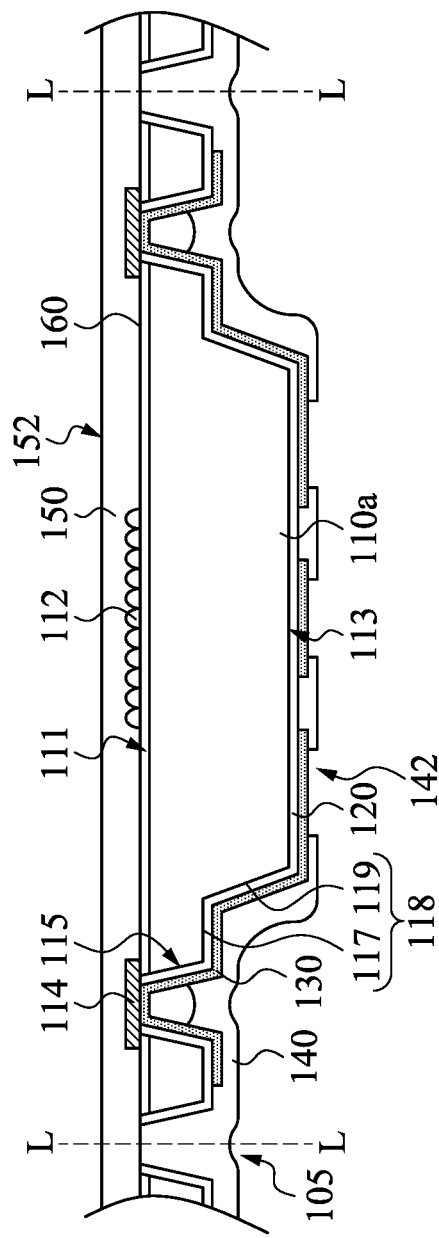
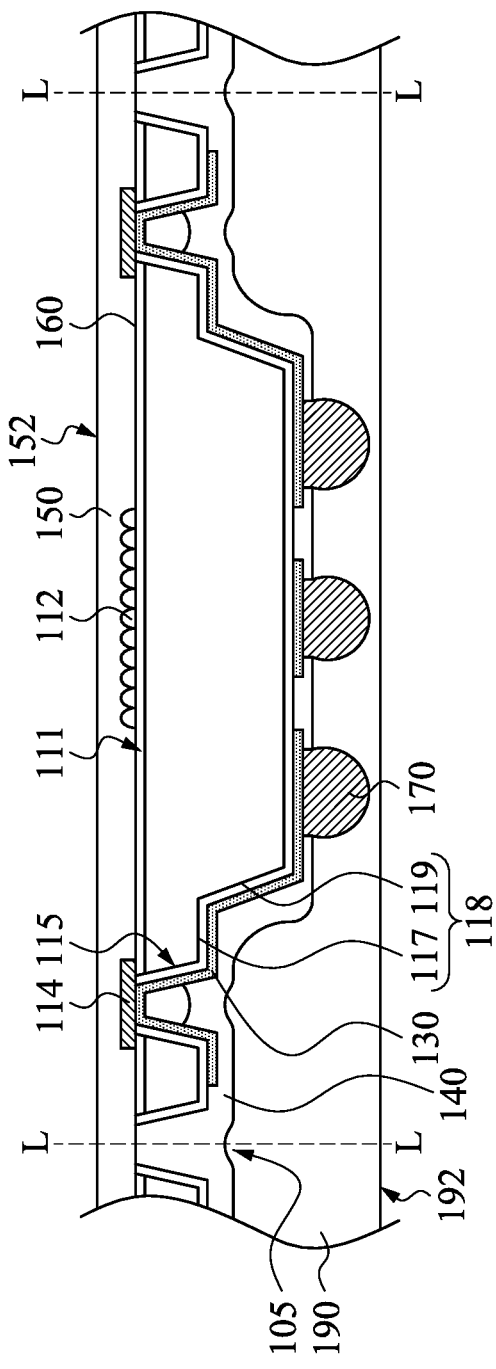
Fig. 15A
Fig. 15B

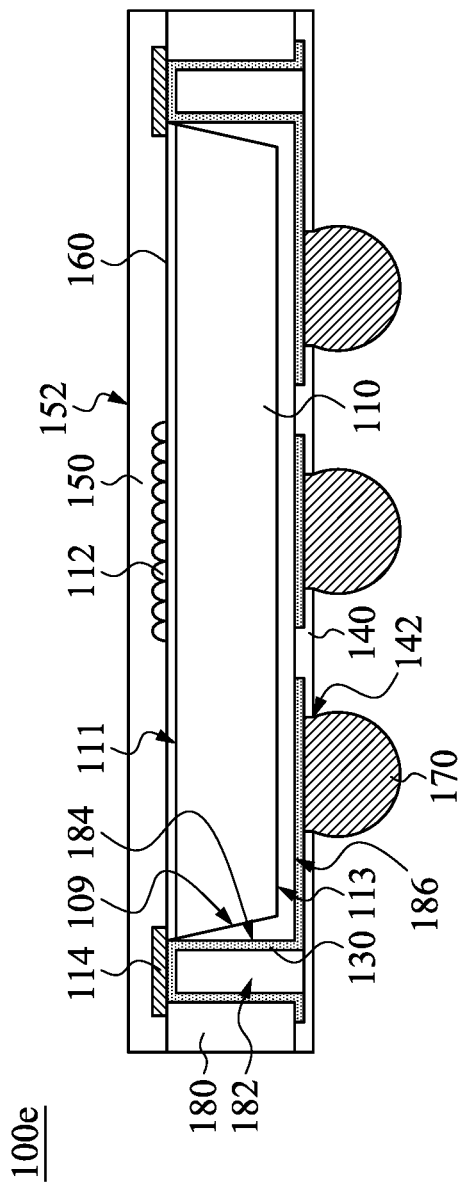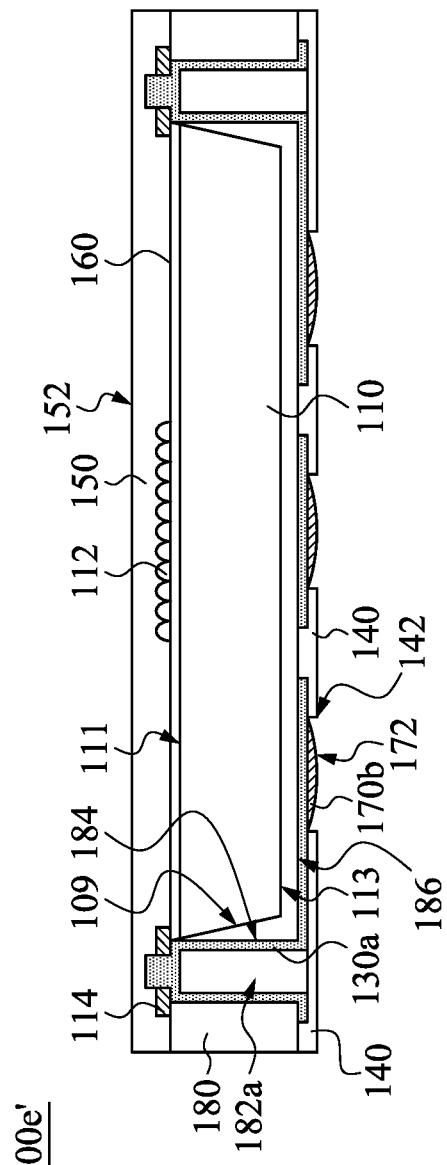
Fig. 17A
Fig. 17B

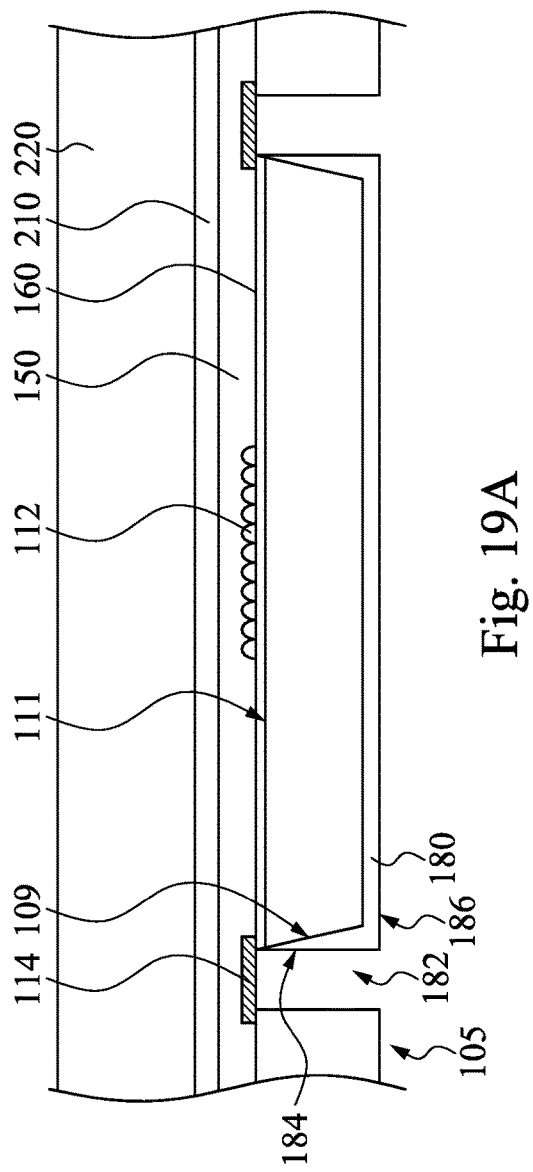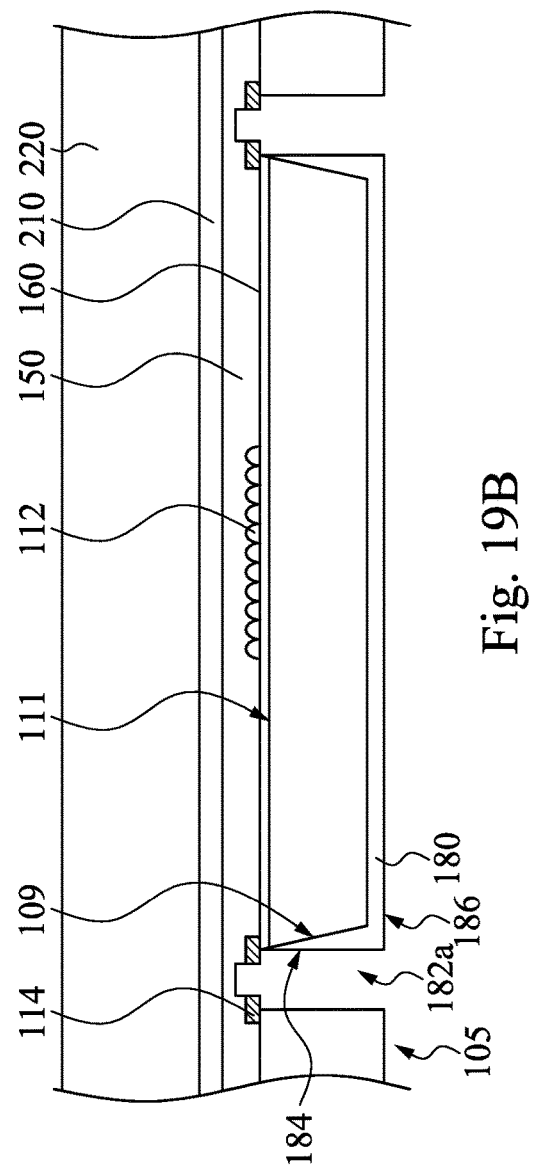

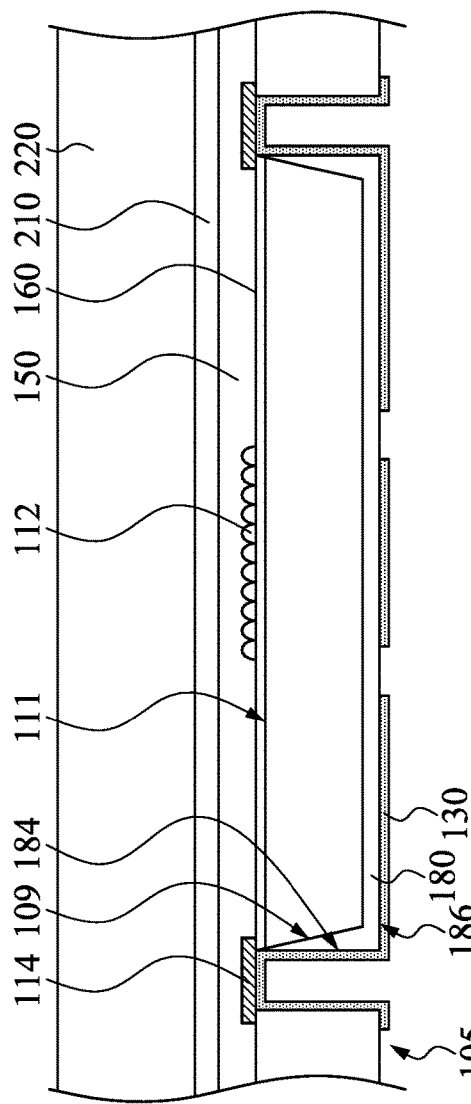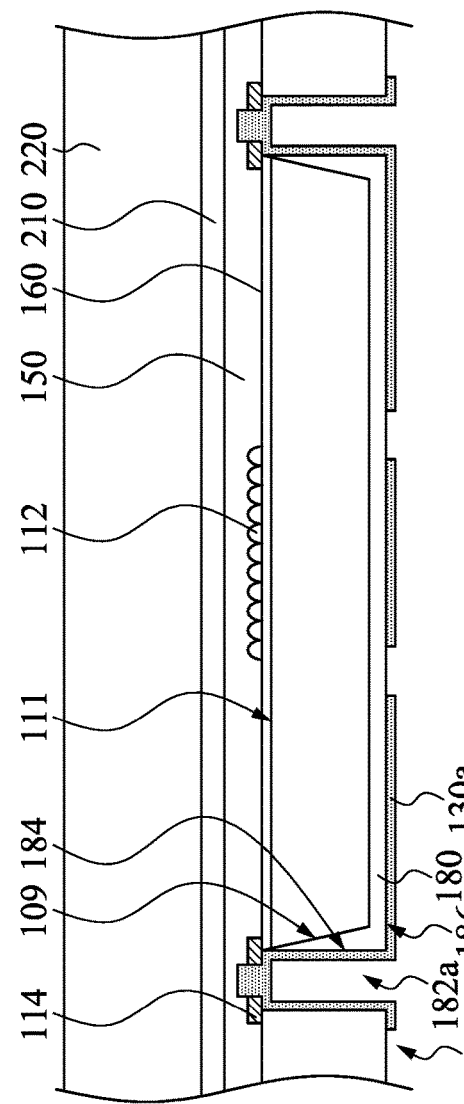

MANUFACTURING METHOD OF CHIP PACKAGE

RELATED APPLICATIONS

This present application is a Divisional Application of U.S. patent application Ser. No. 15/996,841, filed on Jun. 4, 2018, which claims priority to U.S. Provisional Application Ser. No. 62/519,022, filed on Jun. 13, 2017, which are herein incorporated by reference in their entirety.

BACKGROUND

Field of Invention

The present invention relates to a manufacturing method of a chip package.

Description of Related Art

The process of packaging a chip is an important step for forming electronic products. A chip package can protect the chip therein to prevent the chip from environmental pollution, and it also provides electrical connection paths between inner electronic elements of the chip and external devices.

During an electronic product capable of sensing fingerprints being used by a user, moisture or oil stains easily remain on the electronic product, thereby causing the chip package in the electronic product to be polluted. In addition, when the electronic product is operated, a sensor is easily physically damaged, thereby reducing the lifespan of the electronic product. Moreover, the capacitance of a typical electronic product is easily attenuated, thereby affecting the sensing capability of the typical electronic product, such as the capability of sensing fingerprints.

SUMMARY

An aspect of the present invention is to provide a chip package.

According to an embodiment of the present invention, a chip package includes a chip, a first isolation layer, a redistribution layer, a passivation layer, and an encapsulation layer. The chip has a sensor, a conductive pad, a through hole, a top surface, and a bottom surface that is opposite the top surface. The sensor and the conductive pad are located on the top surface, and the conductive pad is in the through hole. The first isolation layer is located on the bottom surface of the chip and a sidewall that surrounds the through hole. The redistribution layer is located on the first isolation layer and is in electrical contact with the conductive pad that is in the through hole. The passivation layer is located on the first isolation layer and the redistribution layer. The passivation layer on the bottom surface of the chip has an opening, and a portion of the redistribution layer is in the opening. The encapsulation layer is located on the top surface of the chip and covers the sensor and the conductive pad. The encapsulation layer has a flat surface facing away from the chip.

An aspect of the present invention is to provide a manufacturing method of a chip package.

According to an embodiment of the present invention, a manufacturing method of a chip package includes forming a temporary bonding layer on a carrier, forming an encapsulation layer on a top surface of a wafer or on the temporary bonding layer, bonding the carrier to the wafer, in which the encapsulation layer and the temporary bonding layer are located between the wafer and the carrier, and the encapsulation layer covers a sensor and a conductive pad of the wafer, patterning a bottom surface of the wafer to form a through hole, in which the conductive pad is exposed through the through hole, forming an isolation layer on the bottom surface of the wafer and a sidewall of the through hole, forming a redistribution layer on the isolation layer and the conductive pad that is in the through hole, forming a passivation layer on the isolation layer and the redistribution layer, in which the passivation layer has an opening, and a portion of the redistribution layer is in the opening, and removing the temporary bonding layer and the carrier.

An aspect of the present invention is to provide a chip package.

According to an embodiment of the present invention, a chip package includes a chip, a molding compound, a redistribution layer, a passivation layer, and an encapsulation layer. The chip has a sensor, a conductive pad, a top surface, a bottom surface that is opposite the top surface, and a lateral surface that adjoins the top surface and the bottom surface. The sensor and the conductive pad are located on the top surface, and the conductive pad protrudes from the lateral surface. The molding compound covers the bottom surface and the lateral surface of the chip, and has a through hole. The conductive pad is in the through hole. The redistribution layer is located on the molding compound and is in electrical contact with the conductive pad that is in the through hole. The passivation layer is located on the molding compound and the redistribution layer. The passivation layer on the bottom surface of the chip has an opening, and a portion of the redistribution layer is in the opening. The encapsulation layer is located on the top surface of the chip and covers the sensor and the conductive pad. The encapsulation layer has a flat surface facing away from the chip.

An aspect of the present invention is to provide a manufacturing method of a chip package.

According to an embodiment of the present invention, a manufacturing method of a chip package includes forming a temporary bonding layer on a carrier, forming an encapsulation layer on a top surface of a wafer or on the temporary bonding layer, bonding the carrier to the wafer, in which the encapsulation layer and the temporary bonding layer are located between the wafer and the carrier, and the encapsulation layer covers a sensor and a conductive pad of the wafer, patterning a bottom surface of the wafer to form a dicing trench, in which the conductive pad is exposed through the dicing trench, molding a molding compound to cover the bottom surface of the wafer and the dicing trench, forming a through hole in the molding compound by laser drilling, in which the conductive pad is in the through hole, forming a redistribution layer on the molding compound and the conductive pad that is in the through hole, forming a passivation layer on the molding compound and the redistribution layer, in which the passivation layer has an opening, and a portion of the redistribution layer is in the opening, and removing the temporary bonding layer and the carrier.

In the aforementioned embodiments of the present invention, the encapsulation layer is located on the top surface of the chip and covers the sensor and the conductive pad, thereby preventing the sensor and the conductive pad from being polluted by moisture, oil stain, or dust. Moreover, the encapsulation layer has the flat surface facing away from the chip, and thus the top of the chip package is configured with full planarization. Such a design is a convenient factor for assembly, and can improve a tactile sensation for users. In addition, when the chip package is a fingerprint sensing device, the encapsulation layer having a suitable thickness and a suitable dielectric constant can prevent capacitance attenuation, thereby improving the detect sensitivity of the chip package for fingerprints.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 1A is a top view of a chip package according to one embodiment of the present invention;

FIG. 1B is a cross-sectional view of the chip package taken along line 1B-1B shown in FIG. 1A;

FIG. 2 is a cross-sectional view of a chip package according to one embodiment of the present invention;

FIGS. 3 to 8 are cross-sectional views of a manufacturing method of a chip package according to one embodiment of the present invention;

FIG. 10A is a cross-sectional view of a chip package according to one embodiment of the present invention;

FIG. 10B is a cross-sectional view of a chip package according to one embodiment of the present invention;

FIGS. 11 to 15B are cross-sectional views of a manufacturing method of a chip package according to some embodiments of the present invention;

FIG. 17A is a cross-sectional view of a chip package according to one embodiment of the present invention;

FIG. 17B is a cross-sectional view of a chip package according to one embodiment of the present invention; and FIGS. 18 to 22 are cross-sectional views of a manufacturing method of a chip package according to some embodiments of the present invention.

DETAILED DESCRIPTION

Figure 3:
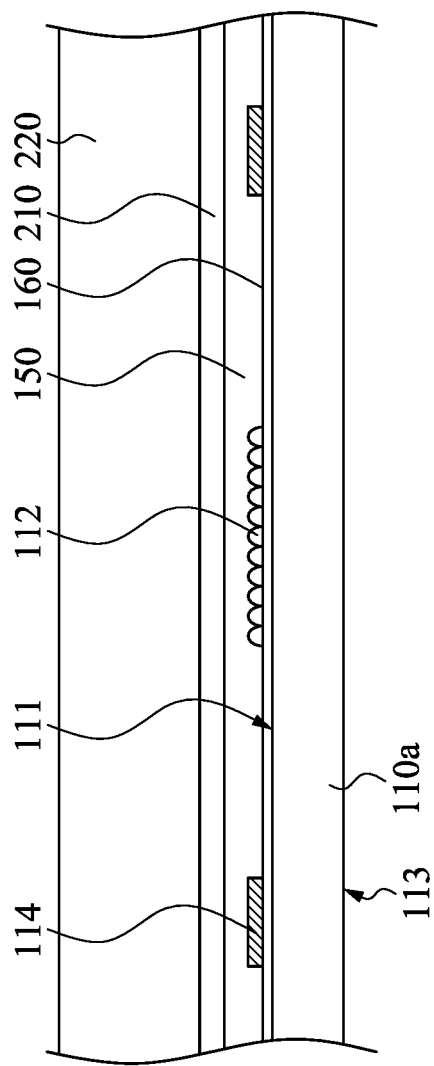

Reference will now be made in detail to the present embodiments of the invention, examples of which are illustrated in the accompanying drawings. Wherever possible, the same reference numbers are used in the drawings and the description to refer to the same or like parts.

FIG. 1A is a top view of a chip package 100 according to one embodiment of the present invention. FIG. 1B is a cross-sectional view of the chip package 100 taken along line 1B-1B shown in FIG. 1A. As shown in FIG. 1A and FIG. 1B, the chip package 100 includes a chip 110, an isolation layer 120, a redistribution layer 130, a passivation layer 140, and an encapsulation layer 150. The chip 110 has a sensor 112, a conductive pad 114, a through hole 116, a top surface 111, and a bottom surface 113 that is opposite the top surface 111. The sensor 112 and the conductive pad 114 are located on the top surface 111 of the chip 110, and the conductive pad 114 is in the through hole 116. The isolation layer 120 is located on the bottom surface 113 of the chip 110 and a sidewall 115 that surrounds the through hole 116. The redistribution layer 130 is located on the isolation layer 120, and is in electrical contact with the conductive pad 114 that is in the through hole 116. The passivation layer 140 is located on the isolation layer 120 and the redistribution layer 130. The passivation layer 140 on the bottom surface 113 of the chip 110 has an opening 142, and a portion of the redistribution layer 130 is in the opening 142. The encapsulation layer 150 is located on the top surface 111 of the chip 110 and covers the sensor 112 and the conductive pad 114. Moreover, the encapsulation layer 150 has a flat surface 152 that faces away from the chip 110.

In this embodiment, the chip 110 may be made of silicon. The sensor 112 is a fingerprint sensor. However, in another embodiment, the sensor 112 may be an image sensor, and the present invention is not limited in this regard. The redistribution layer 130 of the chip package 100 is exposed through the opening 142 of the passivation layer 140, and may be used to electrically connect to a conductive structure of an external electronic element (e.g., a printed circuit board). Such a configuration is described as a land grid array (LGA).

Since the encapsulation layer 150 is located on the top surface 111 of the chip 110 and covers the sensor 112 and the conductive pad 114, the sensor 112 and the conductive pad 114 may be prevented from being polluted by moisture, oil stain, or dust. As a result, the yield and reliability of the chip package 100 can be improved, and the lifespan of the chip package 100 can be extended. Moreover, because the chip package 100 has the encapsulation layer 150, designers may select the chip 110 having a small thickness to reduce the total thickness of the chip package 100 but not to lead the chip 110 to be broken. In addition, the encapsulation layer 150 has the flat surface 152 that faces away from the chip 110, and thus the top of the chip package 100 is configured with full planarization. Such a design is a convenient factor for assembly, and can improve a tactile sensation for users. When the chip package 100 is a fingerprint sensing device, the encapsulation layer 150 having a suitable thickness and a suitable dielectric constant can prevent capacitance attenuation, thereby improving the detect sensitivity of the chip package 100 for fingerprints. For example, the thickness of the encapsulation layer 150 may be in a range from 5 μm to 40 μm, and the dielectric constant of the encapsulation layer 150 may be greater than 5.

Furthermore, the chip package 100 may further include an isolation layer 160. The isolation layer 160 is located on the top surface 111 of the chip 110, and is covered by the encapsulation layer 150.

FIG. 2 is a cross-sectional view of a chip package 100a according to one embodiment of the present invention. The chip package 100a includes the chip 110, the isolation layer 120, the redistribution layer 130, the passivation layer 140, and the encapsulation layer 150. The difference between this embodiment and the embodiment shown in FIG. 1B is that the chip package 100a further includes a conductive structure 170. The conductive structure 170 is located on the redistribution layer 130 that is in the opening 142 of the passivation layer 140, and protrudes from the passivation layer 140. The conductive structure 170 may be used to electrically connect conductive contacts of an external electronic element (e.g., a printed circuit board). Such a configuration is a ball grid array (BGA).

In the following description, manufacturing methods of the chip package 100 of FIG. 1B and the chip package 100a of FIG. 2 will be described.

FIGS. 3 to 8 are cross-sectional views of a manufacturing method of a chip package according to one embodiment of the present invention. As shown in FIG. 3, first of all, a temporary bonding layer 210 is formed on a carrier 220, and the encapsulation layer 150 is formed on the top surface 111 of a wafer 110a or on the temporary bonding layer 210. The wafer 110a is referred to as a semiconductor structure which is not yet divided into plural chips 110 (see FIG. 1B and FIG.

2), such as a silicon wafer. Thereafter, the carrier 220 may be bonded to the wafer 110a through the temporary bonding layer 210 and the encapsulation layer 150, such that the encapsulation layer 150 and the temporary bonding layer 210 are located between the wafer 110a and the carrier 220, and the encapsulation layer 150 covers the sensor 112 and the conductive pad 114 of the wafer 110a. Afterwards, a grinding treatment may be performed on a bottom surface 113 of the wafer 110a to reduce the thickness of the wafer 110a as deemed necessary.

Figure 4:
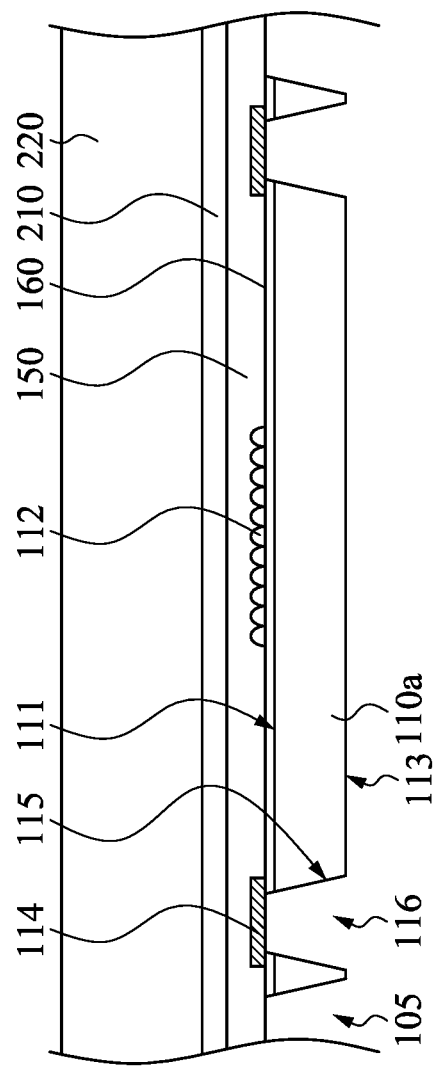

As shown in FIG. 4, after bonding the carrier 220 to the wafer 110a and the grinding treatment, the bottom surface 113 of the wafer 110a is patterned to form the through hole 116, such that the conductive pad 114 is exposed through the through hole 116. In this step, the wafer 110a may be patterned by photolithography. For example, photolithography may include exposure, development, and etch processes. In this embodiment, the bottom surface of the wafer 113 may be patterned to form a dicing trench 105, such that a portion of the wafer 110a is located between the dicing trench 105 and the through hole 116. In the subsequent manufacturing process, the dicing trench 105 may be used as a cutting path for a cutting tool, as shown in FIG. 8.

As shown in FIG. 5, after the through hole 116 is formed, the isolation layer 120 may be formed on the bottom surface 113 of the wafer 110a, the sidewall 115 of the through hole 116, and the conductive pad 114 that is in the through hole 116 through chemical vapor deposition (CVD). Thereafter, an etch process is performed on the isolation layer 120 to remove the isolation layer 120 that is on the conductive pad 114. As shown in FIG. 6, after the formation of the isolation layer 120, the redistribution layer 130 may be formed on the isolation layer 120 and the conductive pad 114 that is in the through hole 116.

As shown in FIG. 7, next, the passivation layer 140 may be formed on the isolation layer 120 and the redistribution layer 130, and a portion of the passivation layer 140 may be located in the dicing trench 105. Moreover, the passivation layer 140 may be patterned to have the opening 142, such that a portion of the redistribution layer 130 is in the opening 142. As shown in FIG. 8, after the formation of the passivation layer 140, the temporary bonding layer 210 and the carrier 220 may be optionally removed. For example, ultraviolet light may be utilized to irradiate the temporary bonding layer 210, thereby eliminating the adhesion of the temporary bonding layer 210. Afterwards, the encapsulation layer 150 and the passivation layer 140 may be cut along the dicing trench 105. In other words, the encapsulation layer 150 and the passivation layer 140 may be cut along line L-L. After the dicing step, the chip package 100 of FIG. 1B can be obtained.

In addition, before the removal of the temporary bonding layer 210 and the carrier 220, the conductive structure 170 (see FIG. 2) may be formed on the redistribution layer 130 that is in the opening 142 of the passivation layer 140, such that the conductive structure 170 may be electrically connected to the conductive pad 114 through the redistribution layer 130. After the formation of the conductive structure 170, the temporary bonding layer 210 and the carrier 220 may be optionally removed, and the encapsulation layer 150 and the passivation layer 140 are cut along line L-L. After the dicing step, the chip package 100a of FIG. 2 can be obtained.

It is to be noted that the connection relationship of the aforementioned elements will not be repeated. In the following description, other types of the chip packages will be described.

Figure 9:
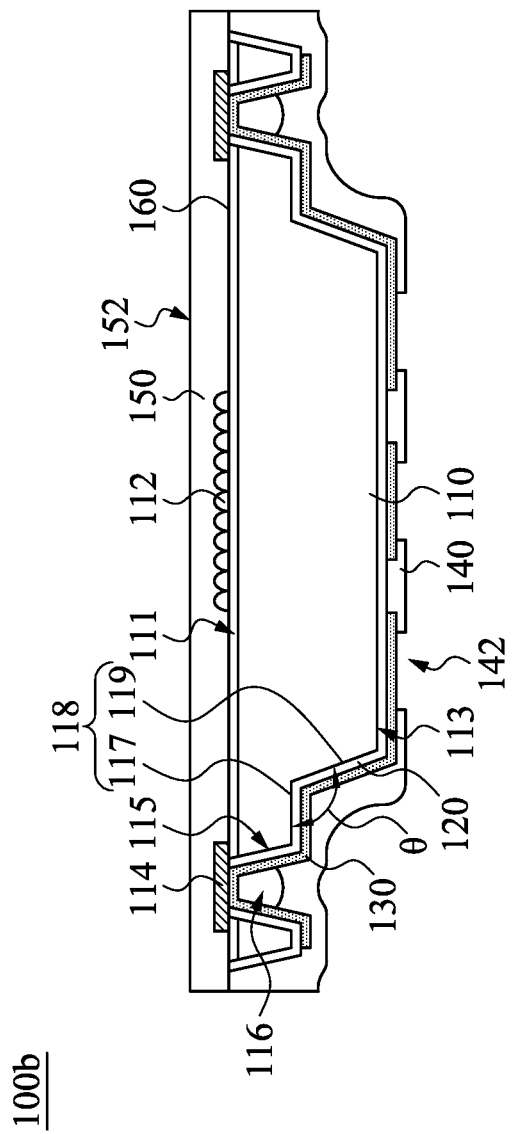
FIG. 9 is a cross-sectional view of a chip package according to one embodiment of the present invention.

FIG. 9 is a cross-sectional view of a chip package 100b according to one embodiment of the present invention. The chip package 100b includes the chip 110, the isolation layer 120, the redistribution layer 130, the passivation layer 140, and the encapsulation layer 150. The difference between this embodiment and the embodiment shown in FIG. 1B is that the chip 110 of the chip package 100b further has a concave portion 118. The through hole 116 is higher than the concave portion 118 in position. The concave portion 118 has two adjacent surfaces 117 and 119, and the surface 117 of the concave portion 118 adjoins the sidewall 115 of the through hole 116, and the surface 119 of the concave portion 118 adjoins the bottom surface 113 of the chip 110. An obtuse angle θ is formed between the two surfaces 117 and 119 of the concave portion 118. The sidewall 115 of the through hole 116, the two surfaces 117 and 119 of the concave portion 118, and the bottom surface 113 of the chip 110 present a step profile. Therefore, the redistribution layer 130 extends from the conductive pad 114 to the bottom surface 113 of the chip 110 along the sidewall 115 of the through hole 116 and the two surfaces 117 and 119 of the concave portion 118, such that the redistribution layer 130 presents a step profile to prevent from being easily broken. In this embodiment, the redistribution layer 130 is exposed through the opening 142 of the passivation layer 140, and thus the chip package 100b has a land grid array.

FIG. 10A is a cross-sectional view of a chip package 100c according to one embodiment of the present invention. The chip package 100c includes the chip 110, the isolation layer 120, the redistribution layer 130, the passivation layer 140, and the encapsulation layer 150. The difference between this embodiment and the embodiment shown in FIG. 9 is that the chip package 100c further includes the conductive structure 170. The conductive structure 170 is located on the redistribution layer 130 that is in the opening 142 of the passivation layer 140. In this embodiment, the conductive structure 170 protrudes from the passivation layer 140, and the chip package 100c has a ball grid array.

FIG. 10B is a cross-sectional view of a chip package 100c' according to one embodiment of the present invention. The chip package 100c' includes the chip 110, the isolation layer 120, the redistribution layer 130, the passivation layer 140, and the encapsulation layer 150. The difference between this embodiment and the embodiment shown in FIG. 9 is that the chip package 100c' further includes a conductive structure 170a and a molding compound 190. The conductive structure 170a is located on the redistribution layer 130 that is in the opening 142 of the passivation layer 140. In this embodiment, the conductive structure 170a has a bottom surface 172 facing away from the redistribution layer 130. The molding compound 190 covers the passivation layer 140 and surrounds the conductive structure 170a. The molding compound 190 has a bottom surface 192 facing away from the passivation layer 140, and the bottom surface 192 of the molding compound 190 and the bottom surface 172 of the conductive structure 170a are at the same horizontal level.

In the following description, manufacturing methods of the chip package 100b of FIG. 9 and the chip package 100c of FIG. 10A will be described.

Figure 11:
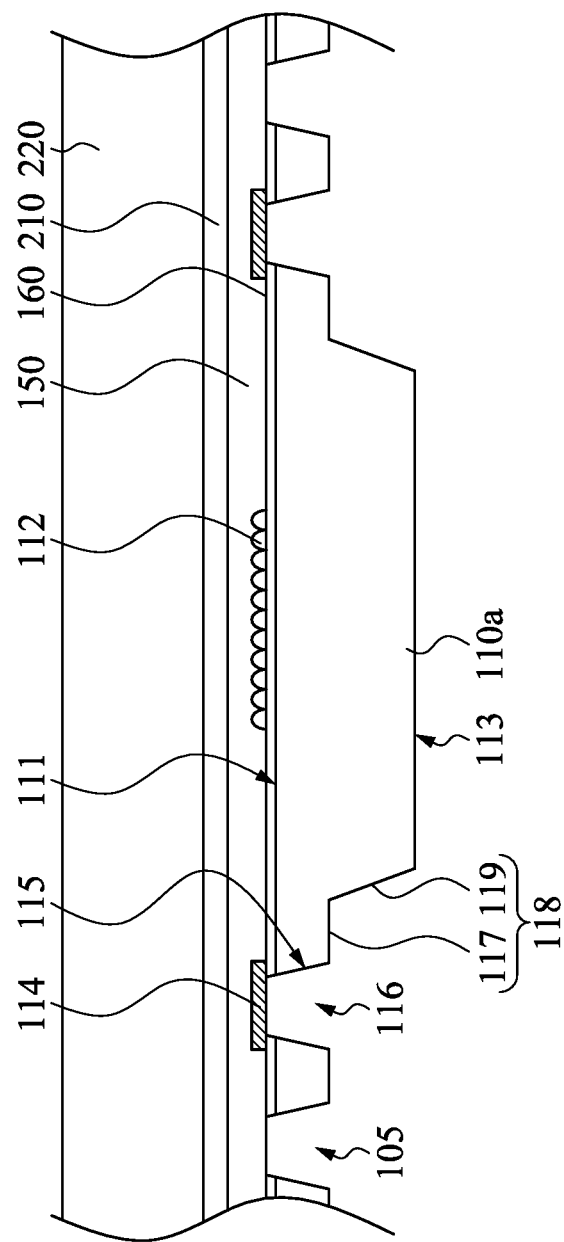

FIGS. 11 to 15B are cross-sectional views of a manufacturing method of a chip package according to some embodiments of the present invention. As shown in FIG. 3 and FIG. 11, first of all, the temporary bonding layer 210 is formed on the carrier 220, and the encapsulation layer 150 is formed on the top surface 111 of the wafer 110a or on the temporary bonding layer 210. Thereafter, the carrier 220 may be bonded to the wafer 110a through the temporary bonding layer 210 and the encapsulation layer 150, and a grinding treatment may be performed on the bottom surface 113 of the wafer 110a to reduce the thickness of the wafer 110a as deemed necessary. After bonding the carrier 220 to the wafer 110a and the grinding treatment, the bottom surface 113 of the wafer 110a may be patterned to form the through hole 116, such that the conductive pad 114 is exposed through the through hole 116. In this step, the bottom surface 113 of the wafer 110a is patterned to form the concave portion 118, and the concave portion 118 has two adjacent surfaces 117 and 119. Thereafter, the surface 117 of the concave portion 118 is patterned to form the through hole 116, such that the two surfaces 117 and 119 of the concave portion 118 are respectively adjoin the sidewall 115 of the through hole 116 and the bottom surface 113 of the wafer 110a. For example, a two-step etch treatment is used to form the concave portion 118 and the through hole 116 in sequence. Moreover, in the step of forming the through hole 116, the wafer 110a may be patterned to form the dicing trench 105, such that a portion of the wafer 110a is located between the dicing trench 105 and the through hole 116. In the subsequent manufacturing process, the dicing trench 105 may be used as a cutting path for a cutting tool, as shown in FIG. 15A.

Figure 12:
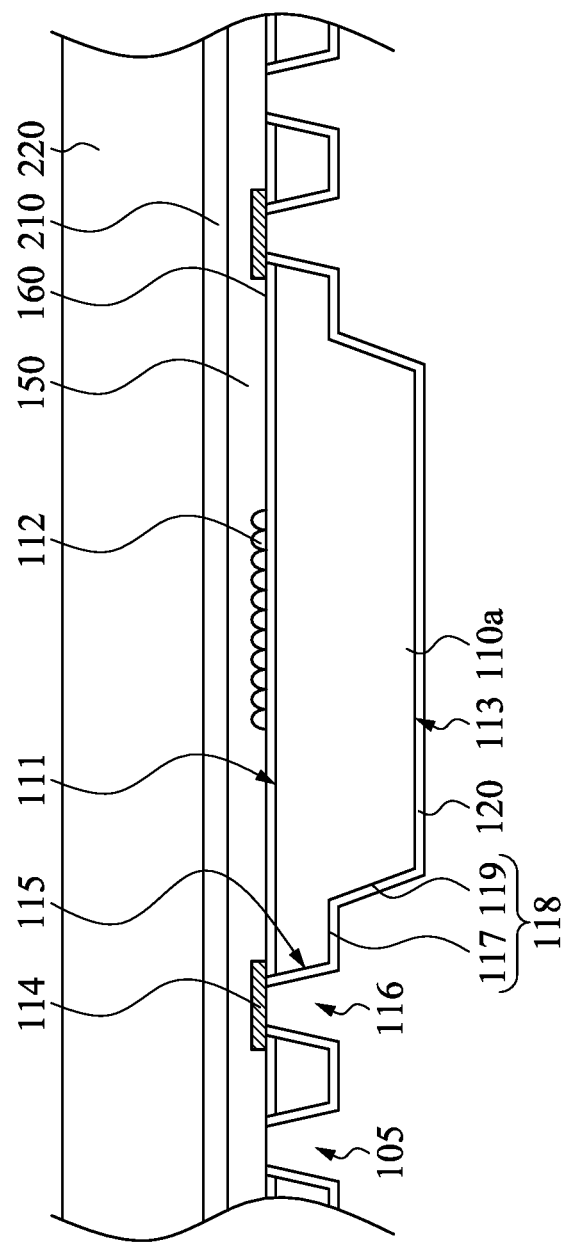
Figure 13:
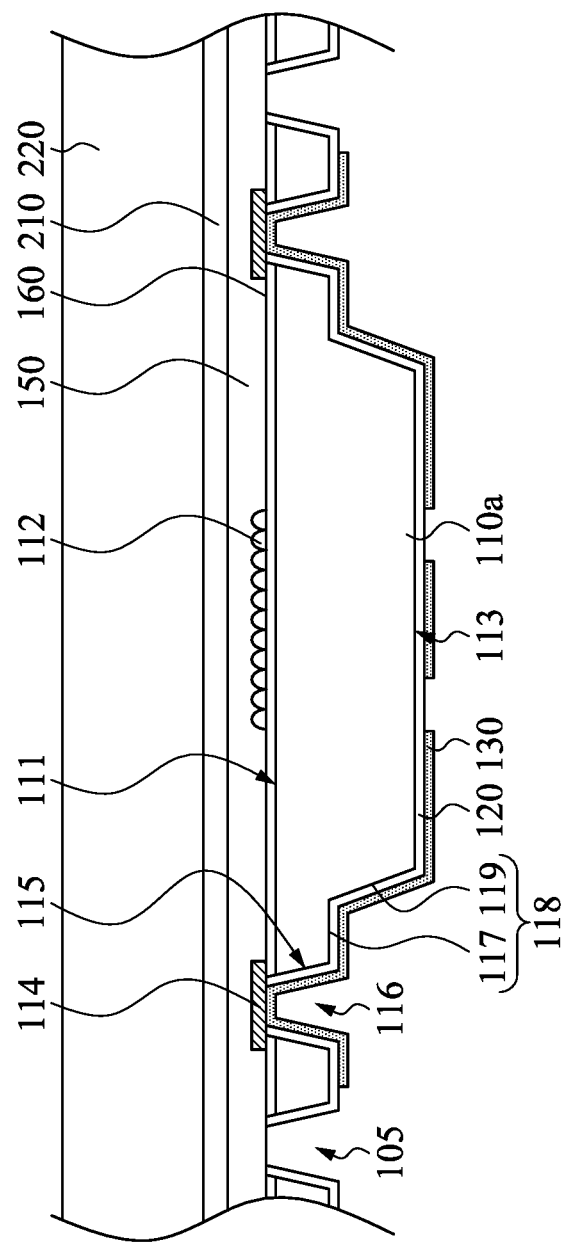

As shown in FIG. 12, after the formations of the concave portion 118 and the through hole 116, the isolation layer 120 may be formed on the bottom surface 113 of the wafer 110a, the surfaces 117 and 119 of the concave portion 118, the sidewall 115 of the through hole 116, and the conductive pad 114 that is in the through hole 116. Thereafter, an etch treatment is performed on the isolation layer 120 to remove the isolation layer 120 that is on the conductive pad 114. As shown in FIG. 13, after the isolation layer 120 is formed, the redistribution layer 130 may be formed on the isolation layer 120 and the conductive pad 114 that is in the through hole 116.

Figure 14:
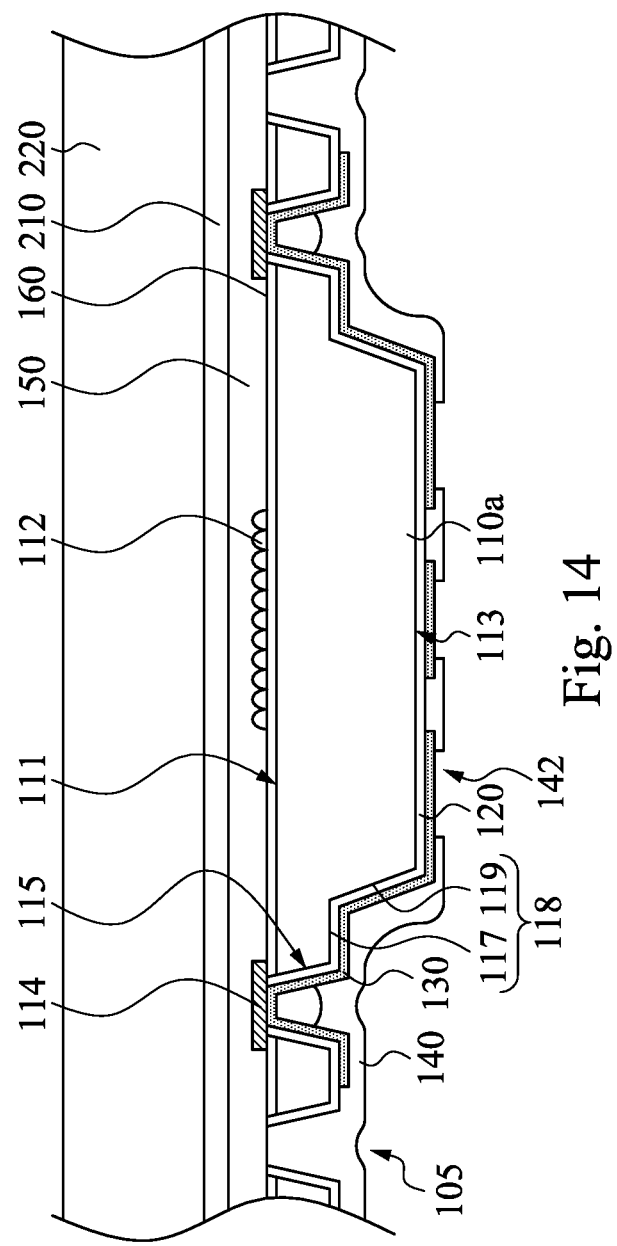

As shown in FIG. 14, next, the passivation layer 140 may be formed on the isolation layer 120 and the redistribution layer 130, and a portion of the passivation layer 140 may be located in the dicing trench 105. Moreover, the passivation layer 140 may be patterned to have the opening 142, such that a portion of the redistribution layer 130 is in the opening 142. As shown in FIG. 15A, after the formation of the passivation layer 140, the temporary bonding layer 210 and the carrier 220 may be optionally removed. For example, ultraviolet light may be utilized to irradiate the temporary bonding layer 210, thereby eliminating the adhesion of the temporary bonding layer 210. Afterwards, the encapsulation layer 150 and the passivation layer 140 may be cut along the dicing trench 105. In other words, the encapsulation layer 150 and the passivation layer 140 may be cut along line L-L. After the dicing step, the chip package 100b of FIG. 9 can be obtained.

In addition, before the removal of the temporary bonding layer 210 and the carrier 220, the conductive structure 170 (see FIG. 10A) may be formed on the redistribution layer 130 that is in the opening 142 of the passivation layer 140, such that the conductive structure 170 may be electrically connected to the conductive pad 114 through the redistribution layer 130. After the formation of the conductive structure 170, the temporary bonding layer 210 and the carrier 220 may be optionally removed, and the encapsulation layer 150 and the passivation layer 140 are cut along line L-L. After the dicing step, the chip package 100c of FIG. 10A can be obtained.

In another embodiment, as shown in FIG. 15B, the conductive structure 170 may be formed on the redistribution layer 130 that is in the opening 142 of the passivation layer 140 and then the molding compound 190 is formed to cover the passivation layer 140 and the conductive structure 170 before the dicing step of FIG. 15A. Thereafter, a grinding treatment may be performed on the molding compound 190 and the conductive structure 170 from the bottom surface 192 of the molding compound 190. As a result, the chip package 100c' having the conductive structure 170a of FIG. 10B can be obtained after a dicing step.

Figure 16:
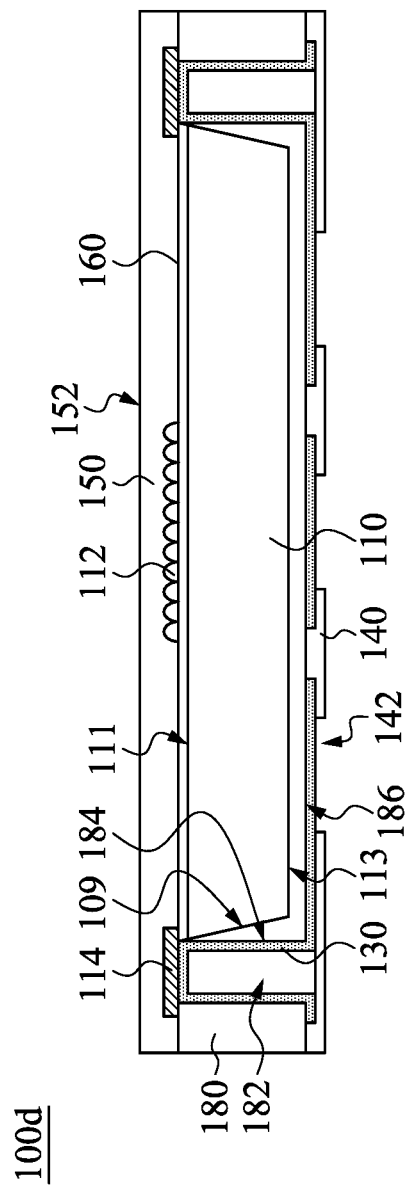
FIG. 16 is a cross-sectional view of a chip package according to one embodiment of the present invention.

FIG. 16 is a cross-sectional view of a chip package 100d according to one embodiment of the present invention. The chip package 100d includes the chip 110, a molding compound 180, the redistribution layer 130, the passivation layer 140, and the encapsulation layer 150. The chip 110 has the sensor 112, the conductive pad 114, the top surface 111, the bottom surface 113 that is opposite the top surface 111, and a lateral surface 109 that adjoins the top surface 111 and the bottom surface 113. The sensor 112 and the conductive pad 114 are located on the top surface 111 of the chip 110, and the conductive pad 114 protrudes from the lateral surface 109. The molding compound 180 covers the bottom surface 113 and the lateral surface 109 of the chip 110, and has a through hole 182. The conductive pad 114 is in the through hole 182. The redistribution layer 130 is located on the molding compound 180 and is in electrical contact with the conductive pad 114 that is in the through hole 182. The passivation layer 140 is located on the molding compound 180 and the redistribution layer 130. In this embodiment, the passivation layer 140 and the molding compound 180 may be made of the same material, such as epoxy, but the present invention is not limited in this regard. The passivation layer 140 on the bottom surface 113 of the chip 110 has an opening 142, and a portion of the redistribution layer 130 is in the opening 142. In this embodiment, the redistribution layer 130 is exposed through the opening 142 of the passivation layer 140, and thus the chip package 100d has a land grid array. The encapsulation layer 150 is located on the top surface 111 of the chip 110 and covers the sensor 112 and the conductive pad 114. The encapsulation layer 150 has the flat surface 152 that faces away from the chip 110. The thickness of the encapsulation layer 150 may be in a range from 5 μm to 40 μm, and the dielectric constant of the encapsulation layer 150 may be greater than 5.

In this embodiment, the molding compound 180 has a surface 184 that surrounds the through hole 182 and a surface 186 that faces away from the bottom surface 113 of the chip 110, and the surface 184 is perpendicular to the surface 186. Moreover, the redistribution layer 130 extends from the conductive pad 114 to the surface 186 of the molding compound 180 along the surface 184 of the molding compound 180. In this embodiment, the chip package 100d may further include the isolation layer 160. The isolation layer 160 is located on the top surface 111 of the chip 110, and is covered by the encapsulation layer 150.

FIG. 17A is a cross-sectional view of a chip package 100e according to one embodiment of the present invention. The chip package 100e includes the chip 110, the molding compound 180, the redistribution layer 130, the passivation layer 140, and the encapsulation layer 150. The difference between this embodiment and the embodiment shown in FIG. 16 is that the chip package 100e further includes the conductive structure 170. The conductive structure 170 is located on the redistribution layer 130 that is in the opening 142 of the passivation layer 140. In this embodiment, the conductive structure 170 protrudes from the passivation layer 140, and thus the chip package 100e has a ball grid array.

FIG. 17B is a cross-sectional view of a chip package 100e' according to one embodiment of the present invention. The chip package 100e' includes the chip 110, the isolation layer 120, a redistribution layer 130a, the passivation layer 140, and the encapsulation layer 150. The difference between this embodiment and the embodiment shown in FIG. 17A is that a conductive structure 170b of the chip package 100e' has a bottom surface 172 facing away from the redistribution layer 130a, and the bottom surface 172 of the conductive structure 170b is level with the passivation layer 140. Moreover, a through hole 182a and the redistribution layer 130a of the chip package 100e' extend to the encapsulation layer 150, in which the redistribution layer 130a may fill the through hole 182a that is in the conductive pad 114 and the encapsulation layer 150.

In the following description, manufacturing methods of the chip package 100d of FIG. 16 and the chip package 100e of FIG. 17A will be described.

Figure 18:
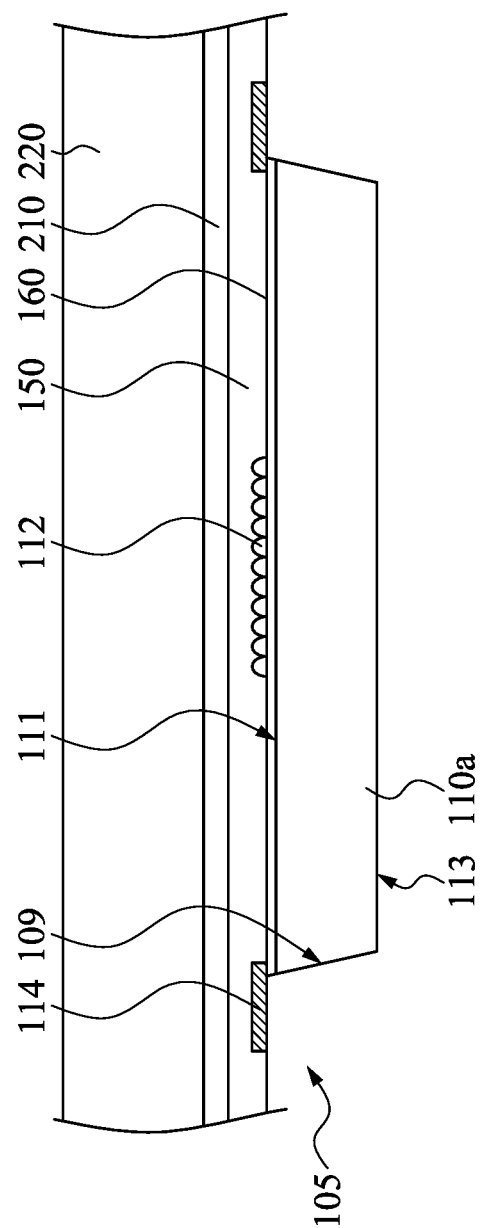
Figure 21:
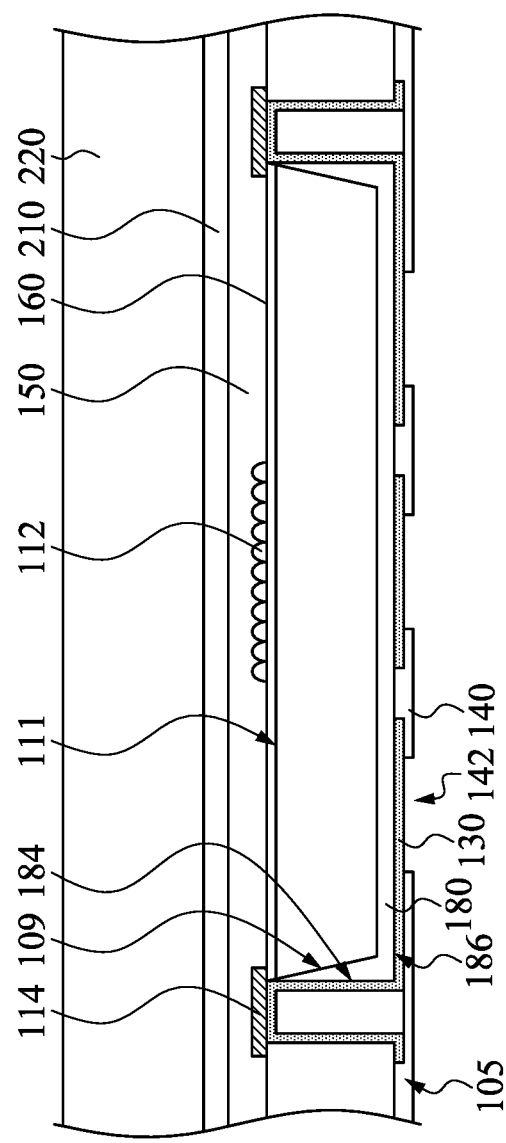
Figure 22:
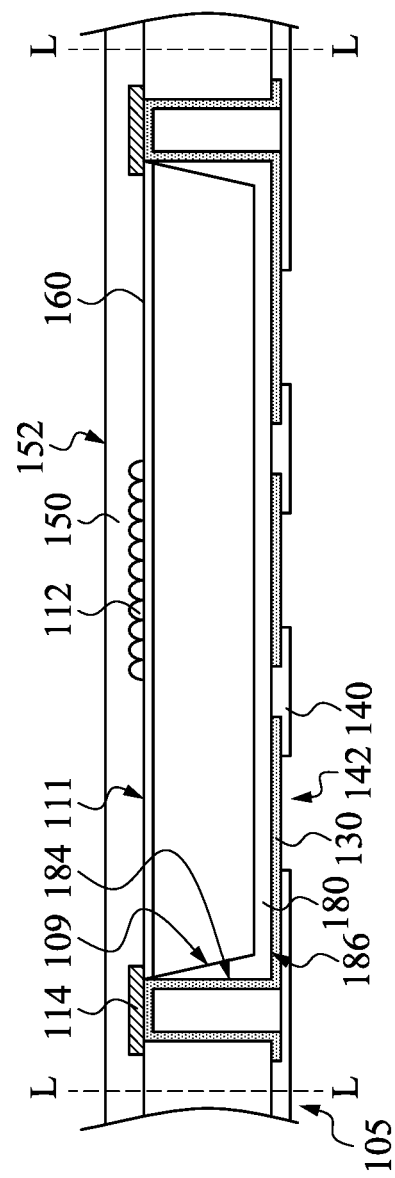

FIGS. 18 to 22 are cross-sectional views of a manufacturing method of a chip package according to some embodiments of the present invention. As shown in FIG. 3 and FIG. 18, first of all, the temporary bonding layer 210 is formed on the carrier 220, and the encapsulation layer 150 is formed on the top surface 111 of the wafer 110a or on the temporary bonding layer 210. Thereafter, the carrier 220 may be bonded to the wafer 110a through the temporary bonding layer 210 and the encapsulation layer 150, and a grinding treatment may be performed on the bottom surface 113 of the wafer 110a to reduce the thickness of the wafer 110a as deemed necessary. After bonding the carrier 220 to the wafer 110a and the grinding treatment, the bottom surface 113 of the wafer 110a may be patterned to form the dicing trench 105, such that the conductive pad 114 is exposed through the dicing trench 105. In the subsequent manufacturing process, the dicing trench 105 may be used as a cutting path for a cutting tool, as shown in FIG. 22.

As shown in FIG. 19A, after the formation of the dicing trench 105, the molding compound 180 is molded to cover the bottom surface 113 of the wafer 110a and the dicing trench 105. Thereafter, the through hole 182 is formed in the molding compound 180 by laser drilling, such that the conductive pad 114 is in the through hole 182. As shown in FIG. 20A, after the formation of the through hole 182 of the molding compound 180, the redistribution layer 130 may be formed on the surfaces 184 and 186 of the molding compound 180 and the conductive pad 114 that is in the through hole 182.

As shown in FIG. 21, next, the passivation layer 140 may be formed on the molding compound 180 and the redistribution layer 130. Moreover, the passivation layer 140 may be patterned to have the opening 142, such that a portion of the redistribution layer 130 is in the opening 142. As shown in FIG. 22, after the formation of the passivation layer 140, the temporary bonding layer 210 and the carrier 220 may be optionally removed. For example, ultraviolet light may be utilized to irradiate the temporary bonding layer 210, thereby eliminating the adhesion of the temporary bonding layer 210. Afterwards, the encapsulation layer 150, the molding compound 180, and the passivation layer 140 may be cut along the dicing trench 105. In other words, the encapsulation layer 150, the molding compound 180, and the passivation layer 140 may be cut along line L-L. After the dicing step, the chip package 100d of FIG. 16 can be obtained.

In addition, before the removal of the temporary bonding layer 210 and the carrier 220, the conductive structure 170 (see FIG. 17A) may be formed on the redistribution layer 130 that is in the opening 142 of the passivation layer 140, such that the conductive structure 170 may be electrically connected to the conductive pad 114 through the redistribution layer 130. After the formation of the conductive structure 170, the temporary bonding layer 210 and the carrier 220 may be optionally removed, and the encapsulation layer 150, the molding compound 180, and the passivation layer 140 are cut along line L-L. After the dicing step, the chip package 100e of FIG. 17A can be obtained.

In another embodiment, as shown in FIG. 19B, after the formation of the molding compound 180, the through hole 182a may be formed in the molding compound 180 by laser drilling, and the through hole 182a passes through the conductive pad 114 and extends to the encapsulation layer 150. Thereafter, as shown in FIG. 20B, the redistribution layer 130a is formed not only on the surfaces 184 and 186 of the molding compound 180 and the conductive pad 114 that is in the through hole 182a, but also on the encapsulation layer 150 that is in the through hole 182a. Next, after the aforementioned steps of forming the passivation layer 140 and the conductive structure 170, removing the temporary bonding layer 210 and the carrier 220, and dicing, the chip package 100e' having the through hole 182a, the redistribution layer 130a, and the conductive structure 170b of FIG. 17B can be obtained.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A manufacturing method of a chip package, comprising:
    forming a temporary bonding layer on a carrier;
    forming an encapsulation layer on a top surface of a wafer or on the temporary bonding layer;
    bonding the carrier to the wafer, wherein the encapsulation layer and the temporary bonding layer are located between the wafer and the carrier, and the encapsulation layer covers a sensor and a conductive pad of the wafer;
    patterning a bottom surface of the wafer to form a concave portion;
    patterning the bottom surface of the wafer to form a through hole, wherein the conductive pad is exposed through the through hole;
    forming an isolation layer on the bottom surface of the wafer and a sidewall of the through hole;
    forming a redistribution layer on the isolation layer and the conductive pad that is in the through hole;
    forming a passivation layer on the isolation layer and the redistribution layer, wherein the passivation layer has an opening, and a portion of the redistribution layer is in the opening;
    removing the temporary bonding layer and the carrier;
    forming a conductive structure on said portion of the redistribution layer; and
    forming a molding compound in the concave portion and in contact with the passivation layer and the conductive structure, wherein a thickness of the molding compound is gradually decreased from a position below the conductive pad to a position that is adjacent to the conductive structure.

2. The manufacturing method of the chip package of claim 1, further comprising grinding the molding compound and the conductive structure such that a bottom surface of the molding compound facing away from the passivation layer and a bottom surface of the conductive structure facing away from the redistribution layer are at the same horizontal level.

3. The manufacturing method of the chip package of claim 1, further comprising:
  patterning the bottom surface of the wafer to form a dicing trench, wherein a portion of the wafer is located between the dicing trench and the through hole, and a portion of the passivation layer is in the dicing trench.

4. The manufacturing method of the chip package of claim 3, further comprising:
  cutting the encapsulation layer and the passivation layer along the dicing trench.

5. The manufacturing method of the chip package of claim 1, wherein the concave portion has two adjacent surfaces, and patterning the bottom surface of the wafer to form the through hole comprises:
  patterning one of the two surfaces of the concave portion to form the through hole, wherein the two surfaces of the concave portion are respectively adjoin the sidewall of the through hole and the bottom surface of the wafer.

6. A manufacturing method of a chip package, comprising:
  forming a temporary bonding layer on a carrier;
  forming an encapsulation layer on a top surface of a wafer or on the temporary bonding layer;
  bonding the carrier to the wafer, wherein the encapsulation layer and the temporary bonding layer are located between the wafer and the carrier, and the encapsulation layer covers a sensor and a conductive pad of the wafer;
  patterning a bottom surface of the wafer to form a dicing trench, wherein the conductive pad is exposed through the dicing trench;
  molding a molding compound to cover the bottom surface of the wafer and the dicing trench;
  after molding the molding compound to cover the bottom surface of the wafer and the dicing trench, forming a through hole in the molding compound by laser drilling, wherein the conductive pad is in the through hole;
  after forming the through hole in the molding compound by laser drilling, forming a redistribution layer on the molding compound and the conductive pad that is in the through hole;
  forming a passivation layer on the molding compound and the redistribution layer, wherein the passivation layer has an opening, and a portion of the redistribution layer is in the opening; and
  removing the temporary bonding layer and the carrier.

7. The manufacturing method of the chip package of claim 6, further comprising:
  forming a conductive structure on the portion of the redistribution layer, wherein a bottom surface of the conductive structure facing away from the redistribution layer protrudes from the passivation layer or is level with the passivation layer.

8. The manufacturing method of the chip package of claim 6, further comprising:
  cutting the encapsulation layer, the molding compound, and the passivation layer along the dicing trench.

9. The manufacturing method of the chip package of claim 6, further comprising:
  extending the through hole to the encapsulation layer by laser drilling; and
  forming the redistribution layer on the encapsulation layer that is in the through hole.

* * * * *